United States Patent
Wang

(10) Patent No.: US 11,322,568 B2
(45) Date of Patent: May 3, 2022

(54) DISPLAY PANEL AND DISPLAY DEVICE HAVING A MICRO-CAVITY STRUCTURE WITH TRANSFLECTIVE LAYERS

(71) Applicant: Wuhan Tianma Micro-Electronics Co., Ltd., Wuhan (CN)

(72) Inventor: Junqiang Wang, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 16/887,597

(22) Filed: May 29, 2020

(65) Prior Publication Data

US 2021/0202635 A1  Jul. 1, 2021

(30) Foreign Application Priority Data

Dec. 30, 2019 (CN) .......................... 201911400202.4

(51) Int. Cl.
*H01L 27/32* (2006.01)
*H01L 51/00* (2006.01)
*H01L 51/52* (2006.01)

(52) U.S. Cl.
CPC ...... *H01L 27/3262* (2013.01); *H01L 27/3246* (2013.01); *H01L 51/0097* (2013.01);
(Continued)

(58) Field of Classification Search
CPC ............. H01L 27/3262; H01L 27/3246; H01L 27/3295; H01L 51/0097; H01L 51/5253; H01L 51/5265; H01L 2251/5338
See application file for complete search history.

(56) References Cited

U.S. PATENT DOCUMENTS 9,812,515 B2 * 11/2017 Oh .................... H01L 27/326
10,930,721 B2 * 2/2021 Yang ................. H01L 27/3262
(Continued)

FOREIGN PATENT DOCUMENTS

CN     103875081 A   6/2014
CN     108962958 A   4/2019
(Continued)

OTHER PUBLICATIONS

Chinese Office Action related to Application No. 201911400202.4; dated Dec. 28, 2021.

*Primary Examiner* — Ida M Soward
(74) *Attorney, Agent, or Firm* — von Briesen & Roper, s.c.

(57) ABSTRACT

Provided are a display panel and a display device having a micro-cavity structure with transflective layers. The display panel includes a first display region, a second display region, a base substrate, a thin film transistor array layer and a pixel definition layer. A pixel density of the first display region is greater than a pixel density of the second display region. The thin film transistor array layer is disposed on a side of the base substrate. The pixel definition layer is disposed on a side of the thin film transistor array layer facing away from the base substrate and includes multiple openings. The second display region includes multiple light emitting regions and multiple light transparent regions. A part of the openings of the pixel definition layer form the light emitting regions. At least one micro-cavity structure is arranged in each of the multiple light transparent regions.

20 Claims, 8 Drawing Sheets

(52) U.S. Cl.
CPC ...... *H01L 51/5253* (2013.01); *H01L 51/5265* (2013.01); *H01L 2251/301* (2013.01); *H01L 2251/5338* (2013.01)

(56) References Cited

U.S. PATENT DOCUMENTS

| | | | | |
|---|---|---|---|---|
| 11,024,695 | B2* | 6/2021 | Liu | H01L 27/3265 |
| 2016/0320878 | A1* | 11/2016 | Hong | G06F 1/1652 |
| 2018/0151660 | A1* | 5/2018 | Kim | H01L 27/3262 |
| 2019/0130840 | A1* | 5/2019 | Park | G09G 3/3266 |
| 2019/0304356 | A1* | 10/2019 | Ka | G09G 3/2092 |
| 2020/0185484 | A1* | 6/2020 | Cho | H01L 27/3276 |
| 2021/0407392 | A1* | 12/2021 | Kim | H01L 27/3288 |

FOREIGN PATENT DOCUMENTS

| | | |
|---|---|---|
| CN | 109599416 A | 4/2019 |
| CN | 109669443 A | 4/2019 |

\* cited by examiner

DISPLAY PANEL AND DISPLAY DEVICE HAVING A MICRO-CAVITY STRUCTURE WITH TRANSFLECTIVE LAYERS

CROSS-REFERENCE TO RELATED APPLICATIONS

The present disclosure claims priority to a Chinese patent application No. 201911400202.4, entitled "Display Panel And Display Device" and filed on Dec. 30, 2019, the content of which is incorporated herein by reference in its entirety.

TECHNICAL FIELD

The present disclosure relates to the field of display technology and, in particular, to a display panel and a display device having a micro-cavity structure with transflective layers.

BACKGROUND

An organic light-emitting diode (OLED) device has the advantages of simple structure, self-luminescence, high contrast, high response speed, low power consumption, etc., and has been widely used in the display field such as a mobile phone, a tablet and a television. With the development of consumer electronics products including a display panel and a camera, such as a mobile phone, a full screen with a high screen-to-body ratio is becoming increasingly popular.

The so-called screen-to-body ratio is a ratio of the area of a screen to the area of a whole machine. A higher screen-to-body ratio may bring a better visual experience to a user.

Taking the mobile phone as an example, in order to achieve the higher screen-to-body ratio, in a related scheme, a non-display region is generally designed on the top of the screen, such as "a liuhai screen" and "a water drop screen" widely adopted at present. With the development of technology, a pixel density of a region provided with the camera is reduced, so that multiple light transparent regions are formed to increase the transmittance of the display panel, which is an implementation of the full screen. However, the transmittance of the film layer of the display panel for light with a long wavelength and light with a short wavelength are different, and especially, the transmittance for blue light with the short wavelength is low, which may cause the color distortion when the camera takes a picture, thereby affecting the user experience.

SUMMARY

The present disclosure provides a display panel and a display device having a micro-cavity structure with transflective layers. By utilizing the display panel, a full-screen display may be implemented, a transmitted light intensity of blue light in a second display region may be enhanced, and an imaging effect of a camera when the camera is provided in the second display region may be enhanced.

In a first aspect, the present disclosure provides a display panel. The display panel includes a first display region, a second display region, a base substrate, a thin film transistor array layer and a pixel definition layer. A pixel density of the first display region is greater than a pixel density of the second display region. The thin film transistor array layer is disposed on a side of the base substrate. The pixel definition layer is disposed on a side of the thin film transistor array layer facing away from the base substrate and includes multiple openings. The second display region includes multiple light emitting regions and multiple light transparent regions, and at least part of the multiple openings of the pixel definition layer forms the light emitting regions. At least one micro-cavity structure is arranged in at least one of the multiple light transparent regions, and each of the at least one micro-cavity structure includes a first transflective layer, a second transflective layer, and at least one dielectric layer disposed between the first transflective layer and the second transflective layer. The micro-cavity structure is configured to enhance interference of blue light in ambient light incident from a light emitting surface of the display panel to the light transparent region.

In a second aspect, the present disclosure further provides a display device. The display device includes the display panel described above, and further includes a light sensing element. The light sensing element is arranged in the second display region of the display panel, and is disposed on a side facing away from the light emitting surface of the display panel. A light sensing surface of the light sensing element faces towards the display panel.

The display panel provided by the present disclosure includes the first display region, the second display region, the base substrate, the thin film transistor array layer and the pixel definition layer. The pixel density of the first display region is greater than the pixel density of the second display region. The thin film transistor array layer is disposed on the side of the base substrate. The pixel definition layer is disposed on the side of the thin film transistor array layer facing away from the base substrate and includes the multiple openings. The second display region includes the multiple light emitting regions and the multiple light transparent regions, and at least part of the multiple openings of the pixel definition layer form the light emitting regions. The at least one micro-cavity structure is arranged in at least one of the multiple light transparent regions, and each of the at least one micro-cavity structure includes the first transflective layer, the second transflective layer, and the at least one dielectric layer disposed between the first transflective layer and the second transflective layer. The micro-cavity structure is configured to enhance the interference of the blue light in the ambient light incident from the light emitting surface of the display panel to the light transparent region.

DETAILED DESCRIPTION

Figure 1:
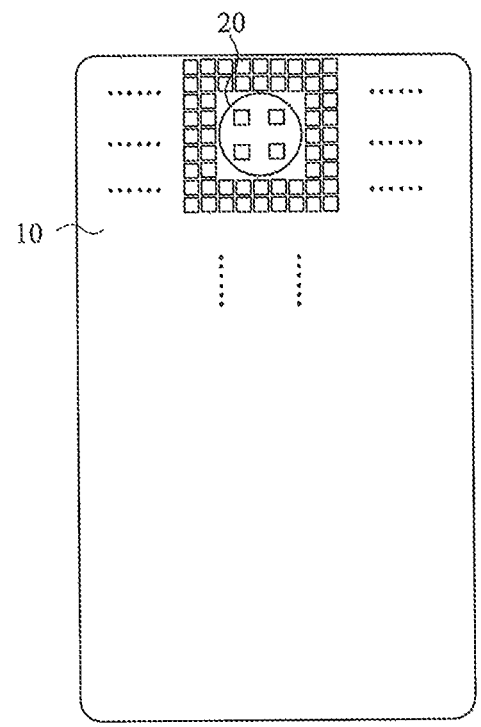
FIG. 1 is a structural diagram of a display panel according to an embodiment of the present disclosure.

The present disclosure will be further described in detail in conjunction with the drawings and embodiments below. It should be understood that the embodiments described herein are merely used for explaining the present disclosure and are not intended to limit the present disclosure. It should also be noted that, for ease of description, only some, but not all, of the structures related to the present disclosure are shown in the drawings.

Terms used in the embodiments of the present disclosure are merely used for describing embodiments and are not intended to limit the present disclosure. It should be noted that the nouns of locality such as "on", "below", "left" and "right" in the embodiments of the present disclosure are described from the perspective of the drawings, and should not be understood as limiting the embodiments of the present disclosure. In addition, in this context, it should also be understood that when an element is referred to as being formed "on" or "below" another element, the element may be directly formed "on" or "below" another element, or may be indirectly formed "on" or "below" another element through an intervening element. The terms "first", "second" and the like are used for description only. The terms "first", "second" and the like do not represent any order, quantity, or importance, but rather are used for distinguishing different components. For those of ordinary skilled in the art, the meanings of the above terms in the present disclosure may be understood according to situations.

Figure 2:
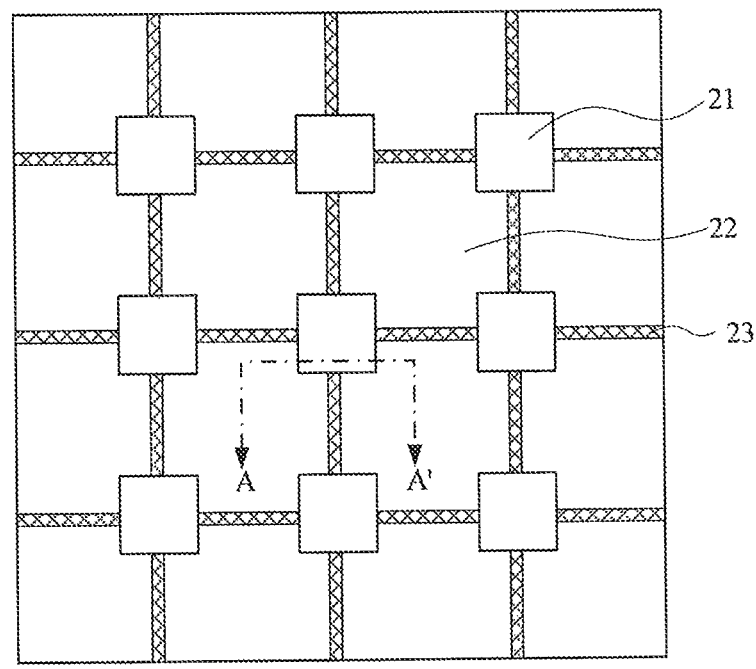
FIG. 2 is a partial structural diagram of a second display region of a display panel according to an embodiment of the present disclosure.
Figure 3:
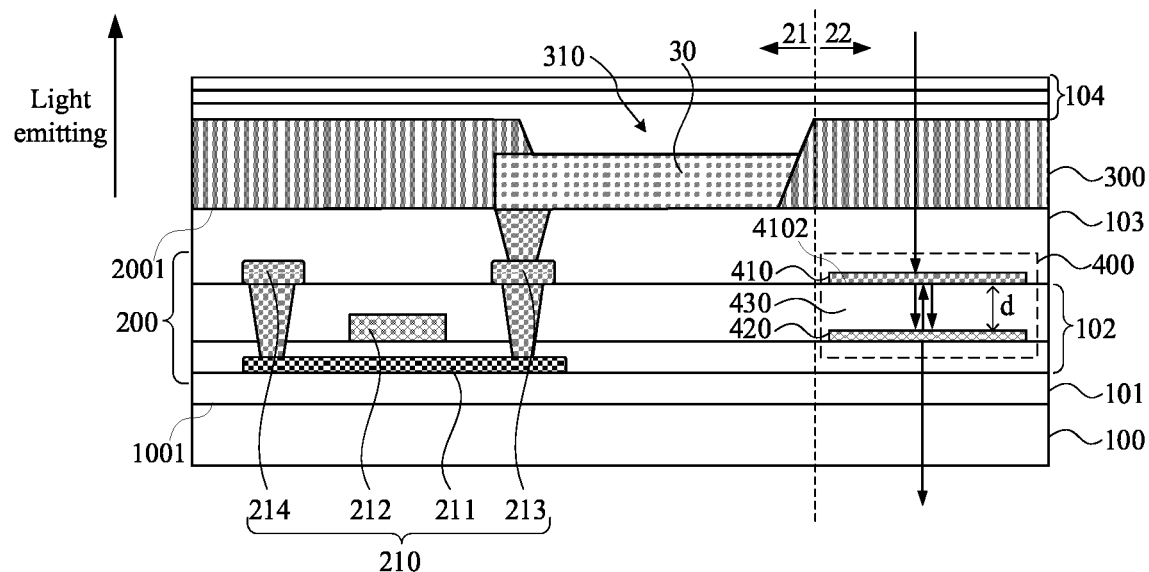
FIG. 3 is a cross-sectional view taken along a section line A-A' of FIG. 2.

FIG. 1 is a structural diagram of a display panel according to an embodiment of the present disclosure, FIG. 2 is a partial structural diagram of a second display region of a display panel according to an embodiment of the present disclosure, and FIG. 3 is a cross-sectional view taken along a section line A-A' of FIG. 2. Referring to FIG. 1, a display panel provided by an embodiment of the present disclosure includes a first display region 10 and a second display region 20. A pixel density of the first display region 10 is greater than a pixel density of the second display region 20. Referring to FIG. 3, the display panel includes a base substrate 100, a thin film transistor array layer 200 and a pixel definition layer 300. The thin film transistor array layer 200 is disposed on a side 1001 of the base substrate 100. The pixel definition layer 300 is disposed on a side 2001 of the thin film transistor array layer 200 facing away from the base substrate 100 and includes multiple openings 310. Referring to FIG. 2, the second display region 20 includes multiple light emitting regions 21 and multiple light transparent regions 22. Referring to FIG. 3, a part of the multiple openings 310 of the pixel definition layer 300 form the light emitting regions 21, at least one micro-cavity structure 400 is arranged in each of the multiple light transparent regions 22, and each of the at least one micro-cavity structure 400 includes a first transflective layer 410, a second transflective layer 420, and at least one dielectric layer 430 disposed between the first transflective layer 410 and the second transflective layer 420. The micro-cavity structure 400 is configured to enhance interference of blue light in ambient light incident from a light emitting surface 600 of the display panel to the light transparent region 22.

It should be understood that the display panel provided by the embodiment of the present disclosure is applicable to a display device in which a light sensing element is required to be arranged below a screen. The light sensing element may be a camera. The following description is based on an example that the light sensing element is the camera. Because the requirement of the camera on the light is higher, in the related art, a hollowed-out region is generally provided at an edge of a display region or inside the display region, and the hollowed-out region may not display, so that a true full-screen design is difficult to be implemented. Since an aperture of the camera for receiving the light is generally arranged to be circular, the second display region 20 exemplarily shown in FIG. 1 is a circular region.

In an implementation, the second display region 20 may be one or more. Moreover, the second display region 20 may be a continuous region or a discontinuous region, which may be designed and determined according to a practical application environment and is not limited herein. In some implementations, a relative position relation between the first display region 10 and the second display region 20 may be as follows: at least part of edges of the second display region 20 overlap with at least part of edges of the first display region 10, and the rest of the second display region 20 is surrounded by the first display region 10. Thus, the second display region 20 may be arranged at the edge of the display region of the display panel. In other implementations, the relative position relation between the first display region 10 and the second display region 20 may also be as follows: the second display region 20 is surrounded by the first display region 10. Thus, the second display region 20 may be arranged inside the display region of the display panel, as shown in FIG. 1. For example, the second display region 20 may be arranged at an upper left corner of the first display region 10. As another example, the second display region 20 may be arranged at an upper right corner of the first display region 10. As another example, the second display region 20 may be arranged on a left side of the first display region 10. As another example, the second display region 20 may be arranged on an upper side of the first display region 10. Of course, in practical applications, a position of the second display region 20 may be designed and determined according to a practical application environment, which is not limited herein.

In an implementation, the shape of the second display region 20 may be set as a regular shape, such as a rectangle, and a vertex angle of the rectangle may be a right angle or an arc-shaped angle. As another example, the shape of the first display region 20 may also be set as a trapezoid, or an inverted trapezoid. Moreover, a vertex angle of the trapezoid may be a regular included angle or an arc-shaped angle. As another example, the shape of the second display region 20 may also be set as an irregular shape. For example, the shape of the second display region 20 may be set as a water drop. Of course, in the practical applications, the shape of the second display region 20 may be designed according to the shape of elements arranged within the second display region 20, which is not limited herein.

In an implementation, the area of the second display region 20 is smaller than the area of the first display region 10. Of course, in the practical applications, it may be designed according to the elements arranged within the second display region 20, which is not limited herein.

In the embodiment of the present disclosure, the relative position relation between the first display region 10 and the second display region 20, and the shapes of the first display region 10 and the second display region 20 are not limited herein, and may be set according to the design of the screen of the display device. Taking a mobile phone as an example, the second display region 20 may be arranged at an upper left corner of the display region, or arranged at an upper right corner of the display region. With the camera arranged at the corner, the second display region 20 may be used for performing simple and quick function services such as displaying time and weather, and reminding information.

Referring to FIG. 2, the light emitting region 21 of the second display region 20 includes at least one light emitting element (which is not shown in FIG. 2). The light emitting element may be an OLED for implementing the normal display of the second display region 20. Since each OLED needs a driving circuit (not shown in FIG. 2) that drives each OLED to emit light, and needs multiple wires for transmitting signals, the second display region 20 further includes multiple wires 23. Four adjacent light emitting regions 21 and the wires 23 among the light emitting regions 21 surround one light transparent region 22, and the light transparent region 22 is used for transmitting ambient light to enable the camera to image. It should be understood that when the camera is used for capturing an image, a display function of the second display region 20 may be turned off to reduce the brightness of the ambient light around the camera during shooting, so that the shooting effect is improved. In other embodiments, for example, when the intensity of the ambient light is sufficiently high, the display function of the second display region 20 may also be turned on during shooting, and the second display region 20 may be in a display state or in a closed state when the camera operates, which is not limited in the embodiment of the present disclosure.

Exemplarily, referring to FIG. 3, the display panel provided by this embodiment may be an organic light emitting display panel, where the base substrate 100 may be a rigid substrate, such as a glass substrate, or may be a flexible substrate, such as a polyimide substrate. The thin film transistor array layer 200 includes multiple thin film transistors 210 arranged in an array. Exemplarily, one thin film transistor 210 is schematically shown in FIG. 3. This thin film transistor 210 includes an active layer 211, a gate electrode 212, a drain electrode 213 and a source electrode 214. The drain electrode 213 is connected to the light emitting element 30 within the light emitting region 21 for driving the light emitting element 30 to emit light. FIG. 3 schematically shows the direction of light emitting from the light emitting element 30 of the display panel. The thin film transistor 210 shown in FIG. 3 being of a top-gate structure is merely schematic, and is not intended to limit the embodiment of the present disclosure. The light emitting element 30 may include a red light emitting element, a green light emitting element and a blue light emitting element. In the light transparent region 22, devices, such as the light emitting element and the thin film transistor, and various transparent film layers are not provided because the transmittance of any one of the transparent film layers to the light may not reach 100%, and the transmittance of the same film layer for different wavelengths is different. In an embodiment, the organic film layer in the display panel has higher transmittance for long-wavelength light than for short-wavelength light, that is, the transmittance for the blue light is relatively low, which easily causes the color distortion when the camera images. At least one micro-cavity structure 400 is arranged in each of the multiple light transparent regions 22. The micro-cavity structure 400 includes a first transflective layer 410, a second transflective layer 420, and at least one dielectric layer 430 (the dielectric layer 430 exemplarily shown in FIG. 3 includes one layer) disposed between the first transflective layer 410 and the second transflective layer 420. In other embodiments, multiple micro-cavity structures 400 may be arranged within one light transparent region 22, for example, the multiple micro-cavity structures 400 may be arranged side by side in a direction parallel to a plane where the base substrate 100 is located, stacked in a direction perpendicular to the plane where the base substrate 100 is located, or arranged according to practical conditions in implementations. FIG. 3 further schematically shows a light path of a micro-cavity structure 400 enhancing the transmitted light intensity of the blue light. The ambient light is incident from the light emitting side of the display panel to the light transparent region 22. Since the first transflective layer 410 and the second transflective layer 420 have a certain degree of reflectivity, the part of the blue light is reflected when the blue light is incident on the second transflective layer 420, and the reflected part of the blue light are reflected once again when it reaches the first transflective layer 410. By controlling the thickness of the dielectric layer 430, the phase difference between the secondary reflected light and the directly transmitted blue light satisfies a condition of constructive interference, thereby the interference may be enhanced when the blue light is transmitted through the micro-cavity structure 400, and the transmitted light intensity of the blue light is increased. Therefore, the color distortion when the camera images is avoided, and the user experience is improved.

In the technical schemes of the embodiment of the present disclosure, the pixel density of the first display region 10 is set to be greater than the pixel density of the second display region 20, and the multiple light transparent regions 22 are formed in the second display region 20, so that a light sensing element (such as a camera) is arranged below the second display region of the display panel, and a full-screen display effect is achieved; at least one micro-cavity structure 400 is arranged in each of the multiple light transparent regions 22, and the micro-cavity structure 400 is configured to enhance the interference of the blue light in the ambient light incident from the light emitting surface of the display panel to the light transparent region 22. Therefore, the transmitted light intensity of the blue light in the second display region 20 is improved, and the imaging effect of the camera when the camera is provided in the second display region 20 is improved.

In an embodiment, with continued reference to FIG. 3, the thickness d of the dielectric layer 430 satisfies a following formula:

$$d = \frac{\lambda}{2} \cdot n.$$

Here, $\lambda$ represents the wavelength of the blue light, and n is a positive integer.

It should be understood that, according to the interference principle, when the optical path difference l of two beams of coherent light satisfies a following formula: $l = m\lambda$, where m is a positive integer, a maximum of the light intensity of interference light is output. In the micro-cavity structure 400 shown in FIG. 3, the blue light has undergone at least one round trip within the dielectric layer 430 of the micro-cavity structure 400, so that the thickness d of the dielectric layer 430 is set to satisfy an integer multiple of a half wavelength of the blue light, that is, d=λ/2·n. Therefore, the blue light may satisfy the condition of constructive interference. In an implementation, a value range of a central wavelength λ of the blue light may be 420 nm to 430 nm, and may be selected according to practical conditions in the implementation.

In an embodiment, the dielectric layer 430 includes at least one organic layer and/or at least one inorganic layer.

Exemplarily, with continued reference to FIG. 3, the display panel further includes an isolation layer 101 arranged between the base substrate 100 and the active layer 211, multiple insulating layers 102 (two insulating layers are schematically shown in FIG. 3), a planarization layer 103, and multi-layer stacked film encapsulation layer 104 (three film layers are schematically shown in FIG. 3). In other embodiments, the display panel further includes a touch electrode layer and a corresponding insulating layer, etc., and the specific film layer and position relation may be set according to practical requirements. The dielectric layer 430 exemplarily shown in FIG. 3 includes one film layer, and this film layer may be the organic layer or the inorganic layer. In other embodiments, the dielectric layer 430 may further include multiple layers, such as the stacked organic layer and the inorganic layer, and it is only necessary to set the thickness of the dielectric layer 430 to satisfy the condition of the constructive interference of the blue light. In an implementation, one or more film layers in the display panel that satisfy the thickness requirements may be directly used as the dielectric layer 430 to reduce the process flow. The dielectric layer 430 may be separately formed during a process of forming the first transflective layer 410 and the second transflective layer 420, which may be flexibly selected according to practical process conditions in the implementation.

Figure 4:
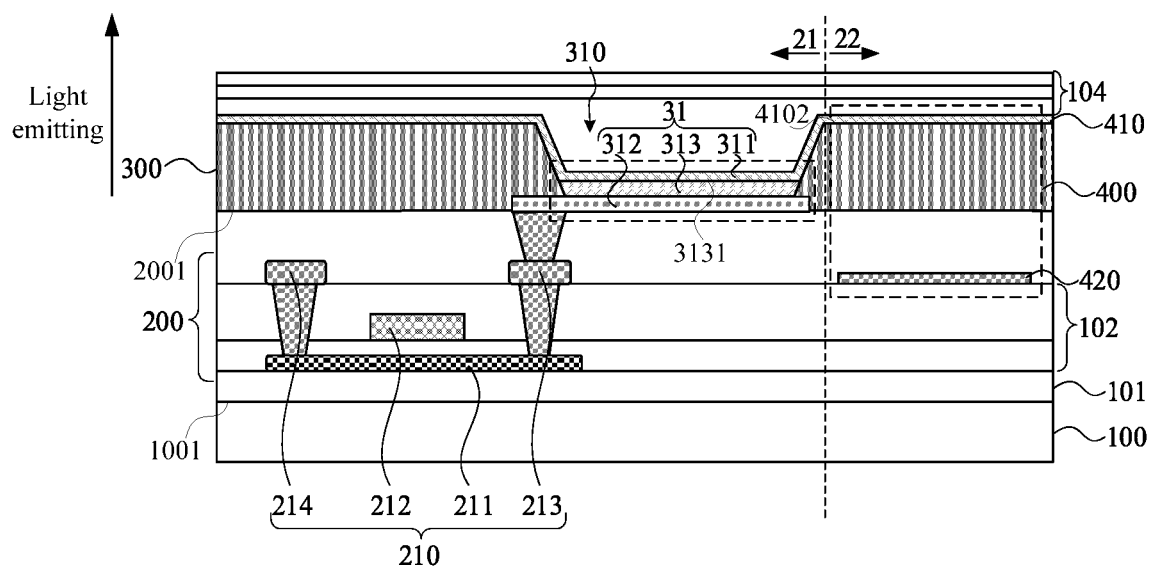
FIG. 4 is another cross-sectional view taken along the section line A-A' of FIG. 2.

FIG. 4 is another cross-sectional view taken along the section line A-A' of FIG. 2. Referring to FIG. 4, in an embodiment, the light emitting region 21 includes multiple first light emitting elements 31. The first light emitting element 31 includes a first electrode layer 311, a second electrode layer 312, and a light emitting function layer 313 disposed between the first electrode layer 311 and the second electrode layer 312. The first electrode layer 311 is disposed on a side 3131 of the light emitting function layer 313 facing away from the base substrate 100, the first electrode layer 311 at least partially covers the light transparent region 22 in the direction perpendicular to the plane where the base substrate 100 is located, and the first electrode layer 311 is reused as the first transflective layer 410.

It should be understood that the first light emitting element 31 may be an OLED, the first electrode layer 311 forms a first electrode of the first light emitting element 31 within the light emitting region 21, and the first electrode may be a translucent emitting electrode, such as a translucent electrode made of silver or a translucent electrode made of silver-magnesium alloy. Since the first electrode layer 311 has a transflective function, in this embodiment, the first electrode layer 311 disposed in the light transparent region 22 is reused as the first transflective layer 410, which is beneficial to reducing a preparation process of the display panel, and may avoid the reduction of the transmittance of the ambient light caused by more layers of the transflective layer being arranged. The second electrode layer 312 includes a second electrode. The second electrode may be a reflective electrode. In an implementation, the second electrode may be an indium tin oxide (ITO), silver and a stacked structure of the ITO to improve the conductivity of the second electrode. When the first electrode is a cathode and the second electrode is an anode, the light emitting function layer 313 may include an electron injection layer, an electron transport layer, a light emitting layer, a hole transport layer and a hole injection layer sequentially stacked in a direction from the first electrode layer 311 towards the second electrode layer 312.

In an embodiment, on the basis that the first electrode layer 311 is reused as the first transflective layer 410 in the above embodiments, the second transflective layer 420 is disposed on a side 4101 of the first transflective layer 410 facing away from the base substrate 100, or the second transflective layer 420 is disposed on a side 4102 of the first transflective layer 410 facing towards the base substrate 100. In the direction perpendicular to the plane where the base substrate 100 is located, the first transflective layer 410 at least partially overlaps with the second transflective layer 420.

It should be understood that, in this embodiment, the micro-cavity structure 400 includes the first transflective layer 410, the second transflective layer 420, and the dielectric layer 430 between these two transflective layers. Since the first transflective layer 410 and the second transflective layer 420 may have the same function, both the first transflective layer 410 and the second transflective layer 420 may be disposed on a side facing towards the light emitting surface of the display panel. When the first electrode layer 311 is reused as the first transflective layer 410, the second transflective layer 420 may be disposed on the side 4101 of the first transflective layer 410 facing away from the base substrate 100, that is, the second transflective layer 420 is disposed above the first transflective layer 410. The second transflective layer 420 may also be arranged on a side 4102 of the first transflective layer 410 facing towards the base substrate 100, that is, the second transflective layer 420 is disposed below the first transflective layer 410, and the first transflective layer 410 at least partially overlaps with the second transflective layer 420 in the direction perpendicular to the plane where the base substrate 100 is located so as to form the micro-cavity structure 400. In an implementation, a position of the second transflective layer 420 may be set according to the practical process flow; which is not limited in the embodiment of the present disclosure.

Figure 5:
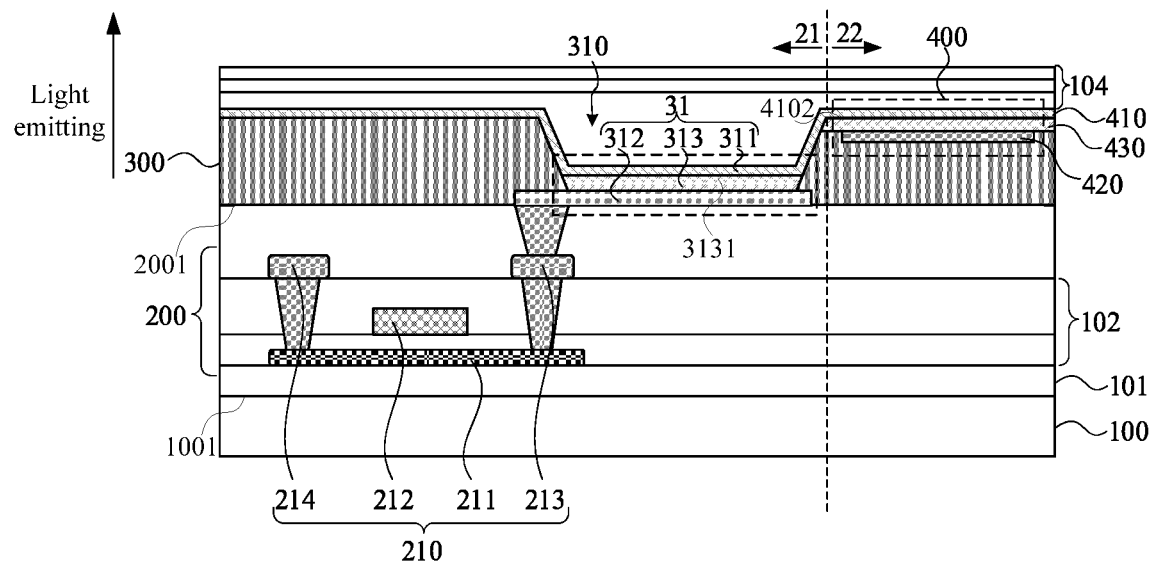
FIG. 5 is another cross-sectional view taken along the section line A-A' of FIG. 2.

FIG. 5 is another cross-sectional view taken along the section line A-A' of FIG. 2. Referring to FIG. 5, in an embodiment, the second transflective layer 420 is disposed on a side 4102 of the first transflective layer 410 facing towards the base substrate 100, and the second transflective layer 420 is arranged between the first electrode layer 311 and the pixel definition layer 300.

In an embodiment, the dielectric layer 430 includes at least one layer of the light emitting function layer 313 or includes a film layer formed of the same material as the pixel definition layer 300.

Exemplarily, with continued reference to FIG. 5, in this embodiment, the dielectric layer 430 and the light emitting function layer 313 are formed of the same material. In an implementation, the light emitting function layer 313 may be formed within the openings 310 of the pixel definition layer 300, meanwhile, the light emitting function layer 313 is formed as the dielectric layer 430 in a region where the micro-cavity structure 400 is arranged at the non-opening of the pixel definition layer 300, so as to reduce the process flow when the dielectric layer 430 is formed separately, which is beneficial to reducing the manufacturing cost of the display panel. The light emitting function layer 313 may include a light emitting layer, and may further include at least one of an electron injection layer, an electron transport layer, a hole transport layer or a hole injection layer, etc., which may be flexibly selected according to the design of the thickness of the dielectric layer 430 in the implementation.

Figure 6:
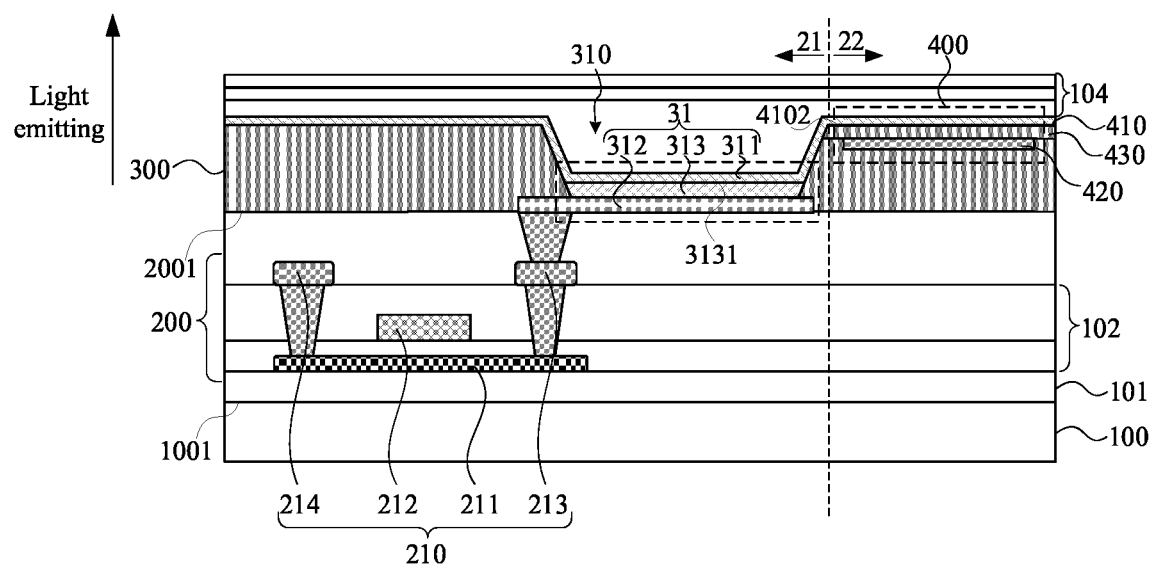
FIG. 6 is another cross-sectional view taken along the section line A-A' of FIG. 2.

FIG. 6 is another cross-sectional view taken along the section line A-A' of FIG. 2. Referring to FIG. 6, in this embodiment, the dielectric layer 430 may also be formed of the same material as the pixel definition layer 300 so as to increase the flexibility of the design of the display panel.

Figure 7:
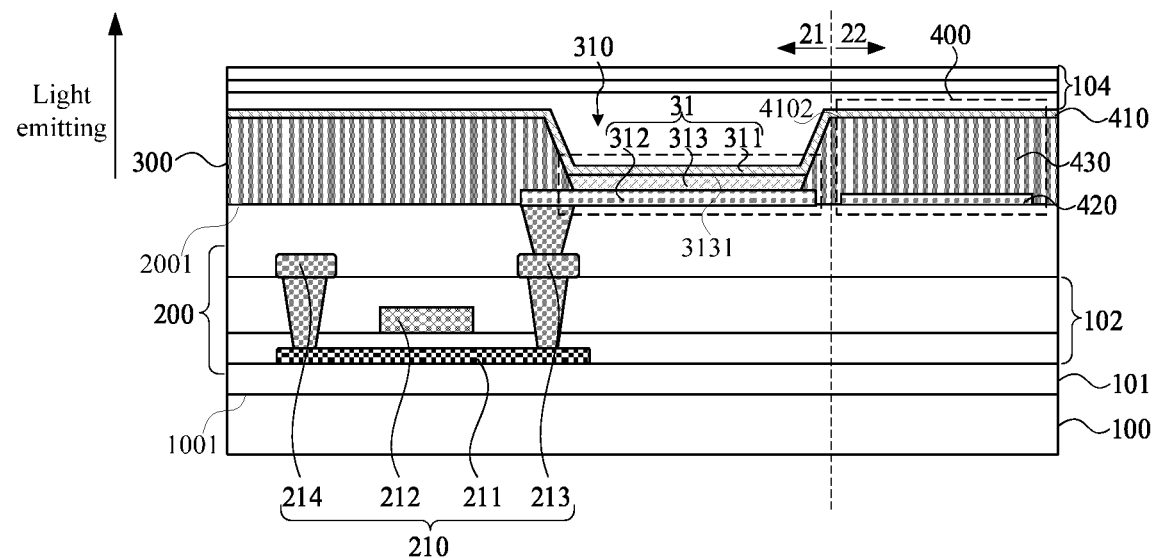
FIG. 7 is another cross-sectional view taken along the section line A-A' of FIG. 2.

FIG. 7 is another cross-sectional view taken along the section line A-A' of FIG. 2. Referring to FIG. 7, in an embodiment, the second transflective layer 420 is disposed on a side 4102 of the first transflective layer 410 facing towards the base substrate 100, and a part of the pixel definition layer 300 disposed in the light transparent region 22 serves as the dielectric layer 430.

It should be understood that, in the embodiment shown in FIG. 7, the second transflective layer 420 may be disposed on the same layer as the second electrode layer 312. In an implementation, the second transflective layer 420 may be formed while the second electrode layer 312 is prepared. For example, the second transflective layer 420 may be formed of silver. The thickness of silver in the second electrode layer 312 is thicker and the silver in the second electrode layer 312 forms a reflective layer. The thickness of silver in the second transflective layer 420 is thinner and the silver in the second transflective layer 420 forms a transflective layer. In an implementation, a speed of evaporation of silver at different positions may be controlled, meanwhile, the reflective layers in the second transflective layer 420 and the second electrode layer 312 are prepared, so as to simplify the process steps of the display panel.

Figure 8:
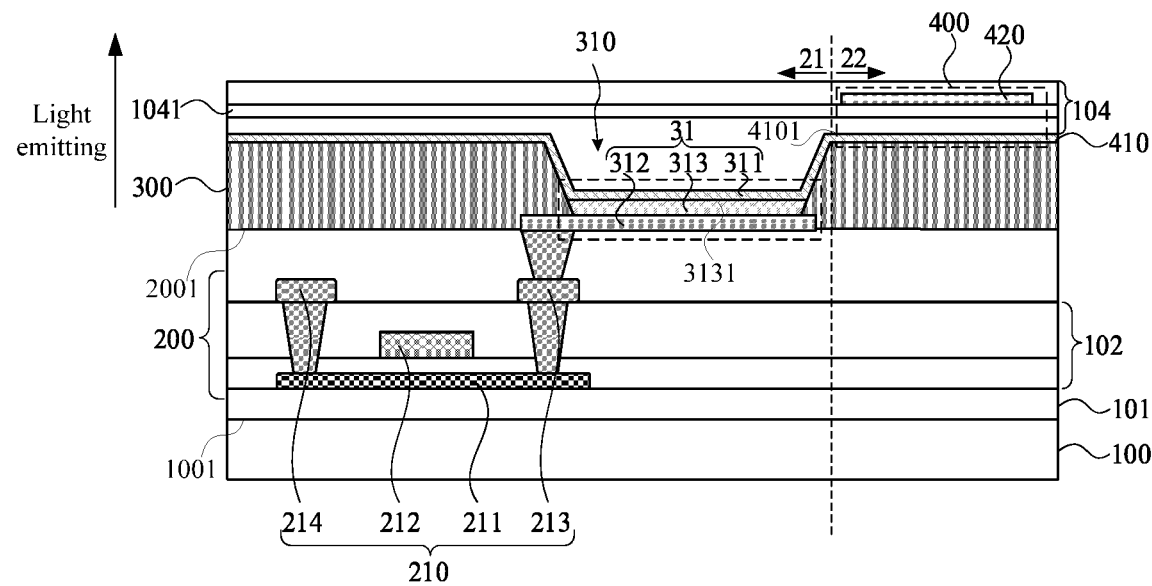
FIG. 8 is another cross-sectional view taken along the section line A-A' of FIG. 2.

FIG. 8 is another cross-sectional view taken along the section line A-A' of FIG. 2. Referring to FIG. 8, in an embodiment, the second transflective layer 420 is disposed on a side 4101 of the first transflective layer 410 facing away from the base substrate 100. The display panel further includes a thin film encapsulation layer 104 covering the first electrode layer 311. The thin film encapsulation layer 104 has a multi-layer structure. FIG. 8 schematically shows that the thin film encapsulation layer 104 includes three film layers, the thin film encapsulation layer 104 includes an inorganic encapsulation layer 1041, the second transflective layer 420 is arranged within the thin film encapsulation layer 104, and the dielectric layer 430 includes at least one film layer in the thin film encapsulation layer 104.

It should be understood that the thin film encapsulation layer 104 is used for preventing micromolecules such as water and oxygen from entering the display panel, and preventing the light emitting element from changing its properties due to contact with water and oxygen. The second transflective layer 420 may be formed of a metal thin film (such as silver). The second transflective layer 420 is arranged inside the thin film encapsulation layer 104, so that the adhesion among the film layers of the thin film encapsulation layer 104 may be significantly improved, the encapsulation reliability may be improved, and the capability of blocking water and oxygen may be improved.

Figure 9:
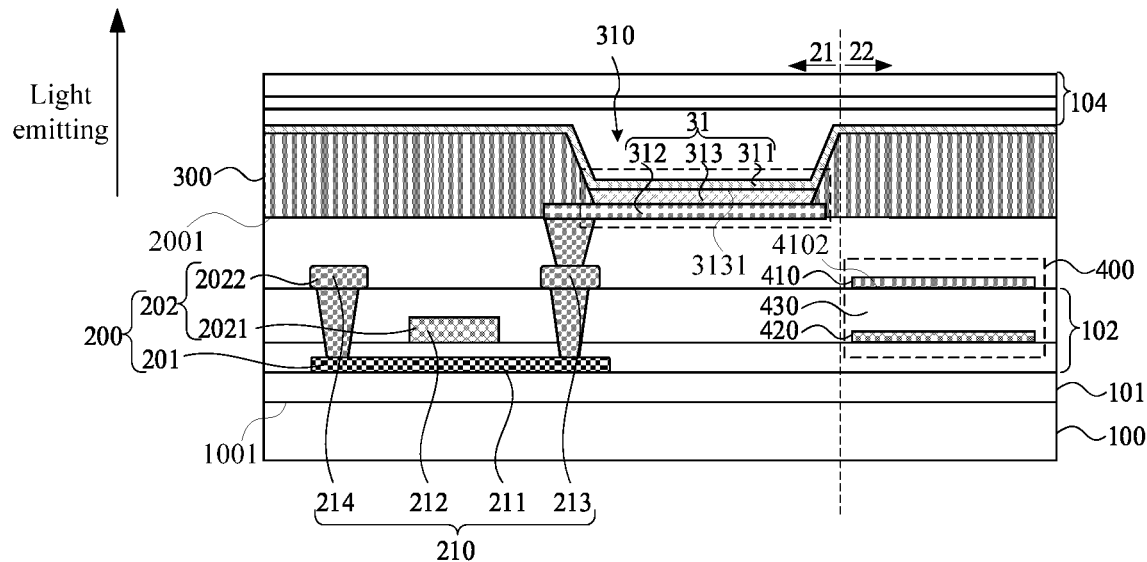
FIG. 9 is another cross-sectional view taken along the section line A-A' of FIG. 2.

FIG. 9 is another cross-sectional view taken along the section line A-A' of FIG. 2. Referring to FIG. 9, in an embodiment, the light emitting region 21 includes multiple first light emitting elements 31. The first light emitting element 31 includes the first electrode layer 311, the second electrode layer 312, and the light emitting function layer 313 disposed between the first electrode layer 311 and the second electrode layer 312. The first electrode layer 311 is disposed on the side 3131 of the light emitting function layer 313 facing away from the base substrate 100. The first electrode layer 311 at least partially covers the light transparent region 22 in the direction perpendicular to the plane where the base substrate 100 is located. The thin film transistor array layer 200 includes at least one semiconductor layer 201, multiple metal layers 202. and multiple insulating layers 203. The dielectric layer 430 includes at least one insulating layer.

It should be understood that the first light emitting element 31 may be an OLED, the first electrode layer 311 forms the first electrode of the first light emitting element 31 within the light emitting region 21, and the first electrode may be a translucent emitting electrode, such as a translucent electrode made of silver or a translucent electrode made of silver-magnesium alloy. The second electrode layer 312 includes a second electrode. The second electrode may be a reflective electrode. In an implementation, the second electrode may be an ITO, silver and a stacked structure of the ITO to improve the conductivity of the second electrode. When the first electrode is a cathode and the second electrode is an anode, the light emitting function layer 313 may include an electron injection layer, an electron transport layer, a light emitting layer, a hole transport layer and a hole injection layer sequentially stacked in the direction from the first electrode layer 311 towards the second electrode layer 312. One semiconductor layer 201, a metal layer 202, a metal layer 2022, and one thin film transistor 210 are only exemplarily shown in FIG. 9. The semiconductor layer 201 forms an active layer 211 of the thin film transistor 210. The metal layer 2021 forms a gate electrode of the thin film transistor 210, and the metal layer 2022 forms a source electrode and a drain electrode of the thin film transistor 210. In addition, the metal layer 2021 and the metal layer 2022 further form various wires (not shown) (which is not shown in FIG. 9) of a pixel driving circuit. The first transflective layer 410 and the second transflective layer 420 may be respectively disposed on the same layer as the metal layer 2021 and the metal layer 2022. In other embodiments, the display panel may further include two semiconductor layers, such as a polysilicon semiconductor layer and a metal oxide semiconductor layer, or may further include more metal layers. In an implementation, the structure of the display panel and positions of the first transflective layer 410 and the second transflective layer 420 may be set according to the practical structure, which is not limited in the embodiment of the present disclosure.

Figure 10:
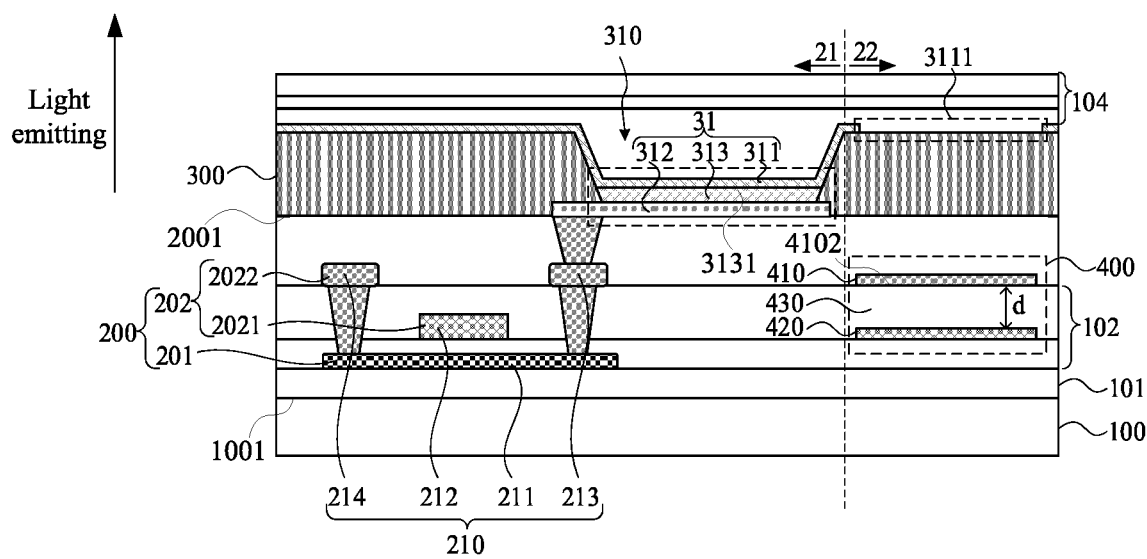
FIG. 10 is another cross-sectional view taken along the section line A-A' of FIG. 2.

FIG. 10 is another cross-sectional view taken along the section line A-A' of FIG. 2. Referring to FIG. 10, in an embodiment, the first electrode layer 311 includes multiple hollow structures 3111. Vertical projections of the multiple hollow structures 3111 on the base substrate 100 at least partially overlaps with a vertical projection of the light transparent region 22 on the base substrate 100.

It should be understood that FIG. 10 is a cross-sectional view of FIG. 2, therefore only a cross-sectional structure of the multiple hollow structures 311 is shown. Since the first electrode layer 311 has certain light absorption, providing the multiple hollow structures 3111 on the first electrode layer 311 may significantly improve the light transparent performance of the light transmission region 22 and improve the imaging effect of the camera.

Figure 11:
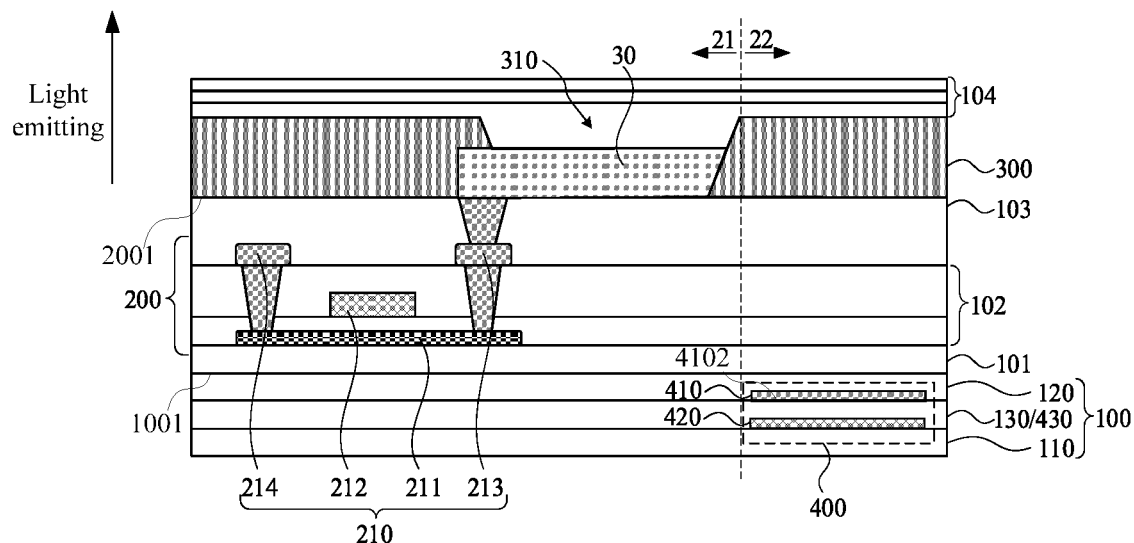
FIG. 11 is another cross-sectional view taken along the section line A-A' of FIG. 2.

FIG. 11 is another cross-sectional view taken along the section line A-A' of FIG. 2. Referring to FIG. 11, in an embodiment, the base substrate 100 includes a first flexible substrate 110, a second flexible substrate 120, and a buffer layer 130 disposed between the first flexible substrate 110 and the second flexible substrate 120. The buffer layer 130 serves as the dielectric layer 430.

The display panel provided by the embodiment of the present disclosure may be a flexible display panel. In order to improve the bending resistance of the flexible display panel, the base substrate 100 of the flexible display panel generally includes two flexible substrates and the buffer layer 130 between the two flexible substrates. The buffer layer 130 serves as the dielectric layer 430, namely, the micro-cavity structure 400 is arranged inside the base substrate 100. A distance between a metal material of the transflective layer and an internal circuit of the display panel is far, so that the coupling of the transflective layer and the internal circuit of the display panel may be avoided, and interference of the transflective layer to the internal circuit when the transflective layer is displayed on the display panel may be avoided.

In an embodiment, referring to FIG. 3 to FIG. 11, the first transflective layer 410 is parallel to the second transflective layer 420.

The first transflective layer 410 is arranged to be parallel to the second transflective layer 420, so that the interference of the blue light may be enhanced at each position within the micro-cavity structure 400, and the transmission intensity of the blue light may be improved.

Figure 12:
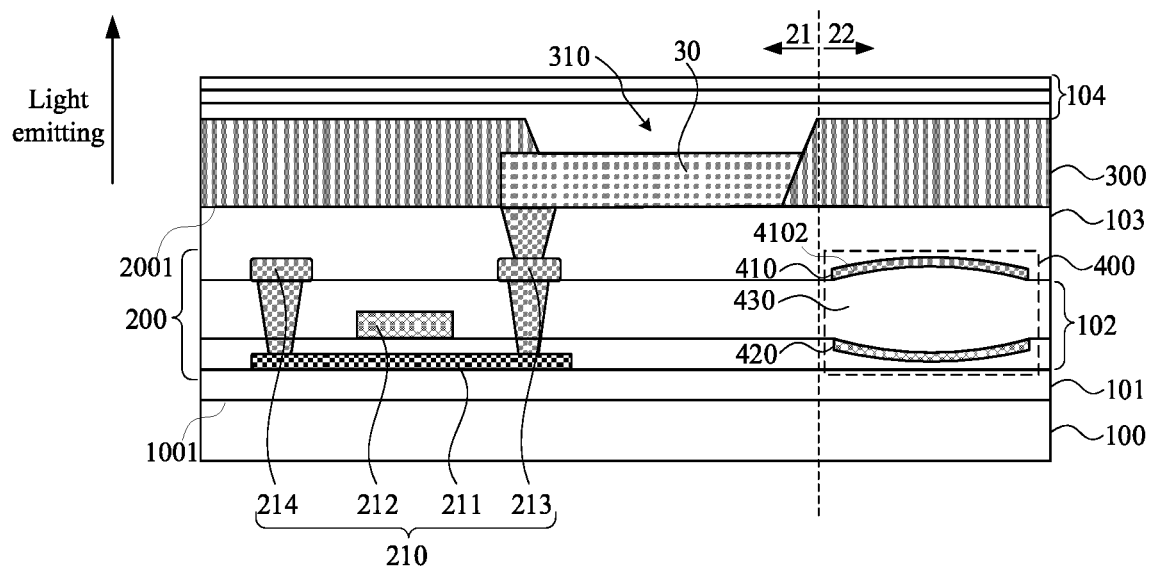
FIG. 12 is another cross-sectional view taken along the section line A-A' of FIG. 2.

FIG. 12 is another cross-sectional view taken along the section line A-A' of FIG. 2. Referring to FIG. 12, in an embodiment, the first transflective layer 410 is arranged on a side of the second transflective layer 420 facing away from the base substrate 100, the first transflective layer 410 is protruded in a direction facing away from the base substrate 100, the second transflective layer 420 is protruded in a direction facing towards the base substrate 100, and a radius of curvature of the first transflective layer 410 is the same as a radius of curvature of the second transflective layer 420.

It should be understood that, the first transflective layer 410 is arranged to be protruded in the direction facing away from the base substrate 100, the second transflective layer 420 is arranged to be protruded in the direction facing towards the base substrate 100, and the dielectric layer 430 within the micro-cavity structure 400 may form a convex lens structure, so that the ambient light is converged, the intensity of the transmitted ambient light is increased, and the imaging effect of the camera is improved. The radius of curvature of the first transflective layer 410 is set to be the same as the radius of curvature of the second transflective layer 420, so that the loss of the light intensity caused by escape of the returned light inside the micro-cavity out of the cavity may be avoided.

Figure 13:
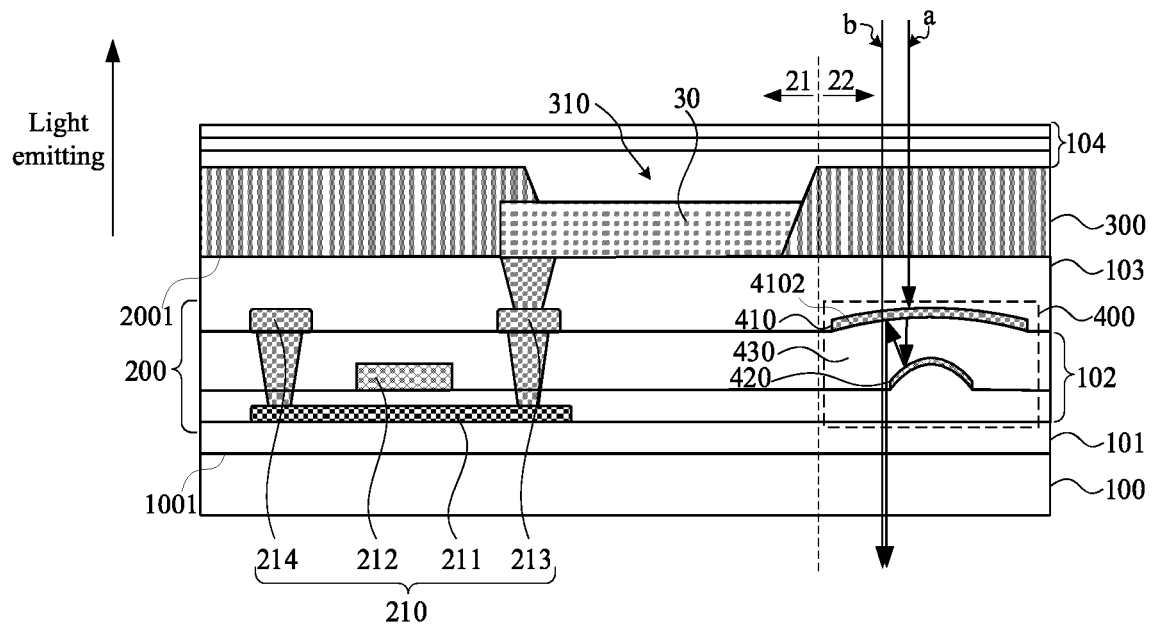
FIG. 13 is another cross-sectional view taken along the section line A-A' of FIG. 2.

FIG. 13 is another cross-sectional view taken along the section line A-A' of FIG. 2. Referring to FIG. 13, in an embodiment, the first transflective layer 410 is arranged on a side of the second transflective layer 420 facing away from the base substrate 100, the first transflective layer 410 is protruded in a direction facing away from the base substrate 100, the second transflective layer 420 is protruded in a direction facing away from the base substrate 100, and a radius of curvature of the first transflective layer 410 is greater than a radius of curvature of the second transflective layer 420.

Schematically, FIG. 13 further exemplarily shows an optical path of the micro-cavity structure 400 to enhance transmitted light intensity of the blue light. A beam of blue light a is transmitted by the first transflective layer 410, incidents on the second transflective layer 420, is reflected by the second transflective layer 420, is reflected by the first transflective layer 410 again, and is coherently superposed with a beam of blue light b, so as to achieve interference enhancement and improve the transmitted light intensity of the blue light.

It should be noted that the embodiments shown in FIG. 12 and FIG. 13 take the micro-cavity structure 400 disposed between the pixel definition layer 300 and the base substrate 100 as an example. When the first electrode layer 311 of the light emitting element is reused as the first transflective layer 410, the two transflective layers may also be designed to have a certain curvature, and the structure thereof is similar to that of the above-described embodiment.

Figure 14:
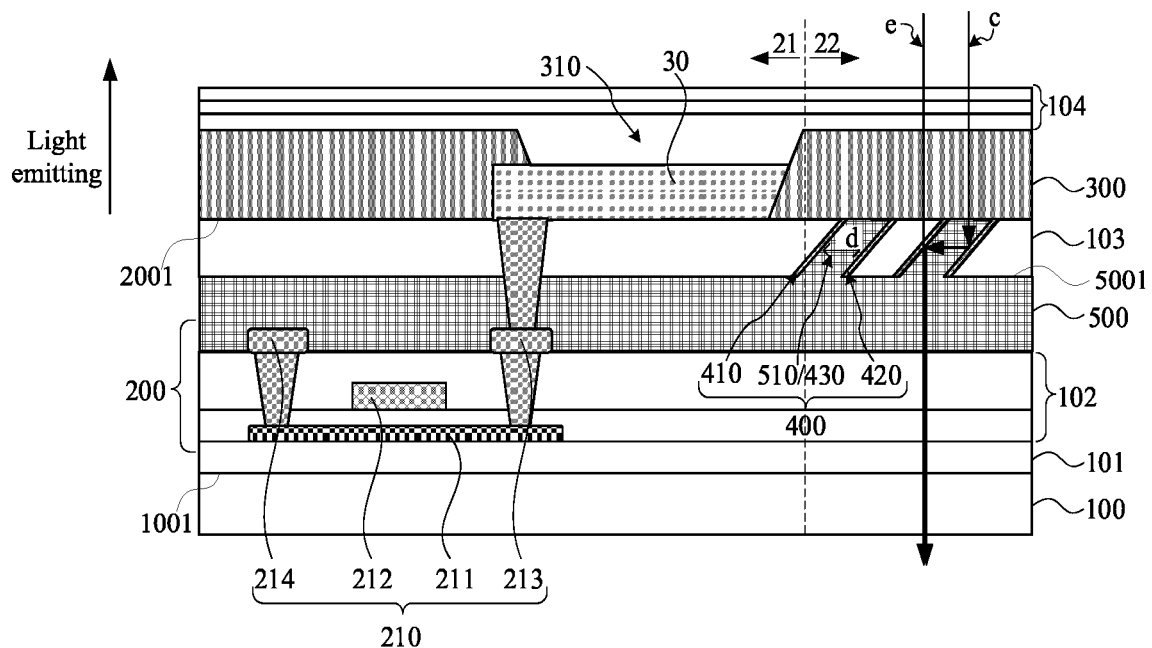
FIG. 14 is another cross-sectional view taken along the section line A-A' of FIG. 2.

FIG. 14 is another cross-sectional view taken along the section line A-A' of FIG. 2. Referring to FIG. 14, in an embodiment, the display panel provided by this embodiment further includes a first organic layer 500 arranged between the thin film transistor array layer 200 and the pixel definition layer 300. The first organic layer 500 is provided with multiple protrusions 510 in the light transparent region 22, the multiple protrusions 510 are towards a side facing away from the base substrate 100, and each of the multiple protrusions 510 includes side walls arranged in parallel. The first transflective layer 410 and the second transflective layer 420 are respectively arranged on surfaces of two side walls of the protrusion 510. An angle between a plane where the first transflective layer 410 is located and a plane where the base substrate 100 is located is an acute angle or an obtuse angle.

It should be understood that, in this embodiment, the protrusion 510 serves as the dielectric layer in the micro-cavity structure 400. FIG. 14 also schematically shows an optical path of the micro-cavity structure 400 to enhance transmitted light intensity of the blue light. A beam of blue light c is reflected by the second transflective layer 420 and then incidents on the first transflective layer 410, is reflected again by the first transflective layer 410, and then is coherently superimposed with a beam of blue light e. In an embodiment, the thickness d of the dielectric layer satisfies a following formula:

$$d=\lambda \cdot n$$

Here, $\lambda$ represents a wavelength of the blue light, and n is a positive integer.

In this embodiment, the light is emitted after being transmitted in a one-way manner in the micro-cavity structure 400 and is not transmitted in the cavity in a reciprocating way. Therefore, in order to achieve interference enhancement, the optical path of the light for the one-way transmission needs to satisfy the conditions of the constructive interference, the thickness d of the dielectric layer 430 satisfies an integral multiple of the wavelength of the blue light, that is, $d=\lambda \cdot n$. Therefore, the transmitted light intensity of the blue light is improved.

In an embodiment, with continued reference to FIG. 14, the display panel further includes a planarization layer 103, and the planarization layer 103 is disposed on a side 5001 of the first organic layer 500 facing away from the base substrate 100. The transmittance of the first organic layer 500 to the blue light is greater than the transmittance of the planarization layer 103 to the blue light.

It should be understood that the planarization layer 103 is used for planarizing the film layers of the display panel, thereby facilitating the preparation of the film layers (such as the pixel definition layer 300 and the light emitting element) above the planarization layer 103. In an implementation, the planarization layer 103 may be made of a resin material. The first organic layer 500 may be made of a polyethylene oxide, polylactide, a polyethylene diamine, etc., or a resin-doped clay, so that the transmittance of the first organic layer 500 to the blue light is greater than the transmittance of the planarization layer 103 to the blue light, and the transmitted light intensity of the blue light is enhanced.

In an embodiment, the angle between the plane where the first transflective layer 410 is located and the plane where the base substrate 100 is located is 45° or 135°.

Exemplarily, with continued reference to FIG. 14, when the angle between the plane where the first transflective layer 410 is located and the plane where the base substrate 100 is located is set to 45° or 135°, ambient light may be guaranteed to incident below the display panel at a small angle so as to be received by the camera, thereby improving the imaging quality.

In an embodiment, referring to FIG. 12 or FIG. 14, the reflectivity of the first transflective layer 410 is greater than the reflectivity of the second transflective layer 420.

Referring to FIG. 12 or FIG. 14, it should be understood that, when part of the ambient light is reflected to the first transflective layer 410 through the second transflective layer 420, in order to prevent excessive ambient light from being transmitted by the first transflective layer 410 to cause light to emit from the side or propagate inside the display panel, the reflectivity of the first transflective layer 410 may be set to be higher so as to reduce the loss of the intensity of the ambient light when the ambient light is transmitted through the light transparent region 22, and improve the intensity of the light received by the camera.

Figure 15:
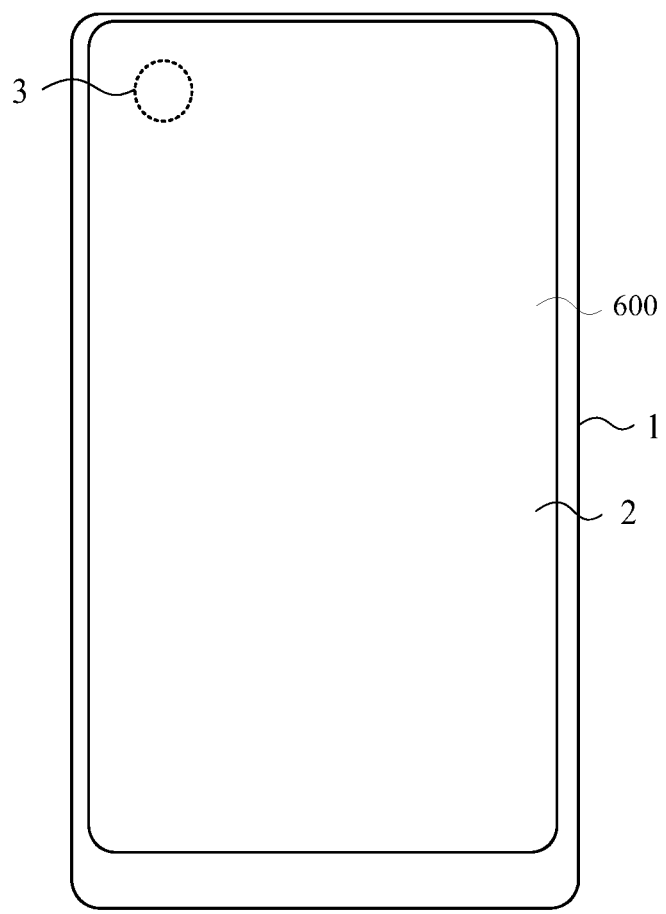
FIG. 15 is a structural diagram of a display device according to an embodiment of the present disclosure.

FIG. 15 is a structural diagram of a display device according to an embodiment of the present disclosure. Referring to FIG. 15, a display device 1 provided by the embodiment of the present disclosure includes any one of the display panels 2 provided by the above embodiments, and further includes a light sensing element 3. The light sensing element 3 is arranged in the second display region of the display panel 2 and disposed on a side facing away from the light emitting surface of the display panel. A light sensing surface of the light sensing element 3 faces towards the display panel 2. The display device 1 may be a mobile phone, a tablet computer, etc.

It should be understood that the light sensing element 3 may be a camera. Since the display device provided by the embodiment of the present disclosure includes any one of the display panels provided by the above embodiments, the same or corresponding technical effects are achieved.

What is claimed is:

1. A display panel, comprising:
   a first display region and a second display region, wherein a pixel density of the first display region is greater than a pixel density of the second display region;
   a base substrate;
   a thin film transistor array layer, disposed on a side of the base substrate; and
   a pixel definition layer, disposed on a side of the thin film transistor array layer facing away from the base substrate and comprising a plurality of openings;
   wherein the second display region comprises a plurality of light emitting regions and a plurality of light transparent regions, and at least part of the plurality of openings of the pixel definition layer form the light emitting regions;
   at least one micro-cavity structure is arranged in at least one of the plurality of light transparent regions, and each of the at least one micro-cavity structure comprises a first transflective layer, a second transflective layer, and at least one dielectric layer disposed between the first transflective layer and the second transflective layer; and
   the micro-cavity structure is configured to enhance interference of blue light in ambient light incident from a light emitting surface of the display panel to the light transparent region.

2. The display panel of claim 1, wherein a thickness d of the dielectric layer satisfies:

$$d = \frac{\lambda}{2} \cdot n;$$

wherein, λ represents a wavelength of the blue light, and n is a positive integer.

3. The display panel of claim 1, wherein the at least one dielectric layer comprises:
   at least one organic layer,
   at least one inorganic layer, or
   at least one organic layer and at least one inorganic layer.

4. The display panel of claim 1, wherein each of the plurality of light emitting region comprises a plurality of first light emitting elements, and each of the plurality of first light emitting elements comprises a first electrode layer, a second electrode layer, and a light emitting function layer disposed between the first electrode layer and the second electrode layer;
   the first electrode layer is disposed on a side of the light emitting function layer facing away from the base substrate, and the first electrode layer at least partially covers the light transparent region in a direction perpendicular to a plane where the base substrate is located; and
   the first electrode layer is reused as the first transflective layer.

5. The display panel of claim 4, wherein the second transflective layer is disposed on a side of the first transflective layer facing away from the base substrate, or the second transflective layer is disposed on a side of the first transflective layer facing towards the base substrate; and
   in the direction perpendicular to the plane where the base substrate is located, the first transflective layer at least partially overlaps with the second transflective layer.

6. The display panel of claim 5, wherein the second transflective layer is disposed on the side of the first transflective layer facing towards the base substrate; and
   the second transflective layer is arranged between the first electrode layer and the pixel definition layer.

7. The display panel of claim 6, wherein the at least one dielectric layer comprises at least one layer of the light emitting function layer or comprises a film layer formed of a same material as the pixel definition layer.

8. The display panel of claim 5, wherein the second transflective layer is disposed on the side of the first transflective layer facing towards the base substrate; and
   a part of the pixel definition layer disposed in the light transparent region serves as the at least one dielectric layer.

9. The display panel of claim 5, wherein the second transflective layer is disposed on the side of the first transflective layer facing away from the base substrate;
   the display panel further comprises a thin film encapsulation layer covering the first electrode layer, wherein the thin film encapsulation layer has a multi-layer structure, the thin film encapsulation layer comprises at least one inorganic encapsulation layer, and the second transflective layer is arranged within the thin film encapsulation layer; and the at least one dielectric layer comprises at least one film layer of the thin film encapsulation layer.

10. The display panel of claim 1, wherein each of the plurality of light emitting region comprises a plurality of first light emitting elements, and each of the plurality of first light emitting elements comprises a first electrode layer, a second electrode layer, and a light emitting function layer disposed between the first electrode layer and the second electrode layer;
the first electrode layer is disposed on a side of the light emitting function layer facing away from the base substrate, and the first electrode layer at least partially covers the light transparent region in a direction perpendicular to a plane where the base substrate is located;
the thin film transistor array layer comprises at least one semiconductor layer, a plurality of metal layers and a plurality of insulating layers; and
the at least one dielectric layer comprises at least one of the plurality of insulating layers.

11. The display panel of claim 10, wherein the first electrode layer comprises a plurality of hollow structures, and a vertical projection of the plurality of hollow structures on the base substrate at least partially overlaps with a vertical projection of the light transparent region on the base substrate.

12. The display panel of claim 1, wherein the base substrate comprises a first flexible substrate, a second flexible substrate, and a buffer layer disposed between the first flexible substrate and the second flexible substrate,
wherein the buffer layer serves as the at least one dielectric layer.

13. The display panel of claim 1, wherein the first transflective layer is parallel to the second transflective layer.

14. The display panel of claim 1, wherein the first transflective layer is arranged on a side of the second transflective layer facing away from the base substrate;
the first transflective layer is protruded in a direction facing away from the base substrate;
the second transflective layer is protruded in a direction facing towards the base substrate; and
a radius of curvature of the first transflective layer is the same as a radius of curvature of the second transflective layer.

15. The display panel of claim 1, wherein the first transflective layer is arranged on a side of the second transflective layer facing away from the base substrate;
the first transflective layer is protruded in a direction facing away from the base substrate;
the second transflective layer is protruded in a direction facing away from the base substrate; and
a radius of curvature of the first transflective layer is larger than a radius of curvature of the second transflective layer.

16. The display panel of claim 1, wherein a thickness d of the dielectric layer satisfies:

$d = \lambda \cdot n;$ wherein, $\lambda$ represents a wavelength of the blue light, and n is a positive integer.

17. The display panel of claim 1, further comprising a first organic layer arranged between the thin film transistor array layer and the pixel definition layer;
wherein the first organic layer is provided with a plurality of protrusions in the light transparent region, the plurality of protrusions is towards to a side facing away from the base substrate, each of the plurality of protrusions comprises side walls arranged in parallel, and the first transflective layer and the second transflective layer are respectively arranged on surfaces of two side walls of the protrusion; and
an angle between a plane where the first transflective layer is located and a plane where the base substrate is located is an acute angle or an obtuse angle;
wherein the display panel further comprises a planarization layer, wherein the planarization layer is disposed on a side of the first organic layer facing away from the base substrate; and
transmittance of the first organic layer to the blue light is greater than transmittance of the planarization layer to the blue light.

18. The display panel of claim 17, wherein the angle between the plane where the first transflective layer is located and the plane where the base substrate is located is 45° or 135°.

19. The display panel of claim 1, wherein reflectivity of the first transflective layer is greater than reflectivity of the second transflective layer.

20. A display device, comprising the display panel, wherein the display panel comprises:
a first display region and a second display region, wherein a pixel density of the first display region is greater than a pixel density of the second display region;
a base substrate;
a thin film transistor array layer, disposed on a side of the base substrate; and
a pixel definition layer, disposed on a side of the thin film transistor array layer facing away from the base substrate and comprising a plurality of openings;
wherein the second display region comprises a plurality of light emitting regions and a plurality of light transparent regions, and at least part of the plurality of openings of the pixel definition layer form the light emitting regions;
at least one micro-cavity structure is arranged in at least one of the plurality of light transparent regions, and each of the at least one micro-cavity structure comprises a first transflective layer, a second transflective layer, and at least one dielectric layer disposed between the first transflective layer and the second transflective layer; and
the micro-cavity structure is configured to enhance interference of blue light in ambient light incident from a light emitting surface of the display panel to the light transparent region;
wherein the display device further comprises: a light sensing element, which is arranged in the second display region of the display panel, and is disposed below the base substrate.

* * * * *